(12) United States Patent
Hendriks et al.

(10) Patent No.: US 11,230,036 B2
(45) Date of Patent: *Jan. 25, 2022

(54) METHOD FOR PERFORMING DELAMINATION OF A POLYMER FILM

(71) Applicants: NCC NANO, LLC, Dallas, TX (US);
Rob Jacob Hendriks, Eindhoven (NL);
Kurt A. Schroder, Coupland, TX (US)

(72) Inventors: Rob Jacob Hendriks, Eindhoven (NL);
Kurt A. Schroder, Coupland, TX (US)

(73) Assignee: NCC NANO, LLC, Dallas, TX (US)

( * ) Notice: Subject to any disclaimer, the term of this patent is extended or adjusted under 35 U.S.C. 154(b) by 471 days.

This patent is subject to a terminal disclaimer.

(21) Appl. No.: 16/307,435

(22) PCT Filed: Jun. 6, 2016

(86) PCT No.: PCT/US2016/036067
§ 371 (c)(1),
(2) Date: Dec. 5, 2018

(87) PCT Pub. No.: WO2017/213623
PCT Pub. Date: Dec. 14, 2017

(65) Prior Publication Data
US 2019/0299496 A1 Oct. 3, 2019

(51) Int. Cl.
*B29C 41/42* (2006.01)
*B29C 41/02* (2006.01)
(Continued)

(52) U.S. Cl.
CPC .............. *B29C 41/02* (2013.01); *B29C 41/42* (2013.01); *B32B 7/00* (2013.01); *B32B 7/06* (2013.01);
(Continued)

(58) Field of Classification Search
None
See application file for complete search history.

(56) References Cited

U.S. PATENT DOCUMENTS 7,132,140 B2 11/2006 Nguyen et al.
7,285,476 B2 * 10/2007 Shimoda ............. H01L 21/6835
438/455

(Continued)

FOREIGN PATENT DOCUMENTS

EP 0858110 B1 12/2006

OTHER PUBLICATIONS

International App. No. PCT/US16/36067, Filing Date Jun. 6 20016, International Search Report and Written Opinion dated Nov. 22, 2016.

*Primary Examiner* — Monica A Huson
*Assistant Examiner* — Kelsey C Grace
(74) *Attorney, Agent, or Firm* — Antony P. Ng; Russell Ng PLLC

(57) ABSTRACT

A method and apparatus for delaminating a polymer film from a carrier plate is disclosed. The carrier plate is at least partially transparent and has deposited on it a pixelated pattern layer of light-absorptive material, upon which is deposited a layer of light-reflective material. A polymer film, which is to be delaminated, is deposited on the light-reflecting material layer. Next, a pulsed light source is utilized to irradiate through the carrier plate from the side opposite the polymer film to heat the light-absorptive material layer. The heated areas of the light-absorptive material layer, in turn, heat the polymer film through conduction at the interface between the light-absorptive material layer and the polymer film, thereby generating gas from the polymer film by its thermal decomposition, which allows the polymer film to be released from the carrier plate.

20 Claims, 3 Drawing Sheets

(51) Int. Cl.
  *B32B 7/00* (2019.01)
  *B32B 7/06* (2019.01)
  *B29L 7/00* (2006.01)
  *B29L 31/34* (2006.01)
  *H01L 21/683* (2006.01)

(52) U.S. Cl.
  CPC ..... *B29L 2007/008* (2013.01); *B29L 2031/34* (2013.01); *H01L 21/6836* (2013.01)

(56) References Cited

U.S. PATENT DOCUMENTS

| | | |
|---|---|---|
| 9,130,194 B2 | 9/2015 | Lee et al. |
| 10,011,104 B2 * | 7/2018 | Hendriks .............. B32B 43/006 |
| 2002/0172887 A1 | 11/2002 | Wolk et al. |
| 2017/0348959 A1 * | 12/2017 | Hendriks .............. B32B 43/006 |

* cited by examiner

METHOD FOR PERFORMING DELAMINATION OF A POLYMER FILM

BACKGROUND OF THE INVENTION

1. Technical Field

The present invention relates to thermal processes in general, and, in particular, to a method for performing delamination of a polymer film.

2. Description of Related Art

Many types of printed electronic structures can be deposited on a polymer substrate. One method of printing high-resolution electronic structures with registered layers and/or having a well-defined thicknesses is to deposit various layers onto a very flat surface. This can be done by depositing a polymer film onto a rigid, flat carrier plate (substrate) such as glass, and then forming the subsequent layers on top of the polymer film. After the electronic structures have been formed, the polymer film must be removed from the carrier plate.

SUMMARY OF THE INVENTION

In accordance with a preferred embodiment of the present invention, a pixelated pattern layer of light-absorptive material is initially deposited onto a carrier plate, and a light-reflective material layer is then deposited on the light-absorptive material layer. A polymer film, which is to be delaminated, is deposited on the light-reflecting material layer. Next, a pulsed light source is utilized to irradiate through the carrier plate from the side opposite the polymer film to heat the light-absorptive material layer. The heated areas of the light-absorptive material layer, in turn, heat the polymer film through conduction at the interface between the carrier plate stack and the polymer film, thereby generating gas from the polymer film by its thermal decomposition, which allows the polymer film to be released from the carrier plate.

Optionally, a surface tension controlled release layer may be deposited on top of the light-reflecting material layer. Also, a dynamic release layer may be deposited prior to the polymer film.

The carrier plate may be made of glass or quartz. The polymer film may be made of polyimide. The surface tension controlled release layer may be made of ceramic such as silicon nitride or silicon dioxide.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

One method of removing a polymer film from a carrier plate is to first deposit a thermal release layer on the carrier plate before depositing the polymer film. After forming electronic structures on the polymer film, the entire assembly (carrier plate, thermal release layer, polymer film, and electronic structures) are heated to a temperature high enough for the thermal release layer to release the polymer film. One disadvantage of this method is that the processing temperature needed to form the electronic structures must be lower than the release temperature of the thermal release layer.

Another method of removing a polymer film from a carrier plate is to use a pulsed excimer laser such as a XeFl laser at 308 nm. The laser beam from the excimer laser is shined through the carrier plate side and focused at an interface between the polymer film and the carrier plate. This process generates a tiny amount of gas that delaminates the polymer film at the interface between the polymer film and the carrier plate. As the area of delamination is very small (approximately 1 mm$^2$), the laser beam can be pulsed and scanned to delaminate a larger area. The first disadvantage of this method is that excimer lasers tend to be very expensive, and the second disadvantage is that this method has a very low throughput when compared to other methods.

Figure 1A:
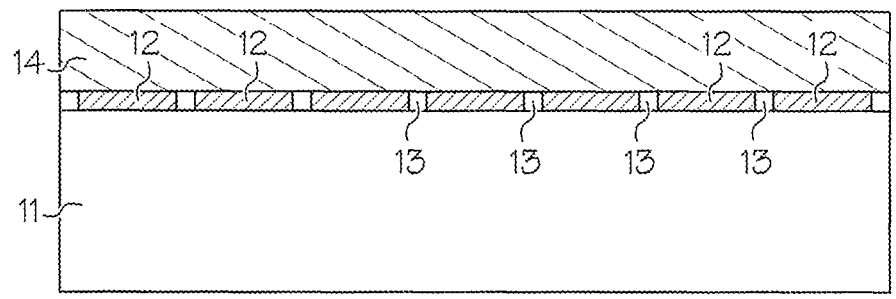
FIGS. 1A-1B illustrate a method for performing selective delamination of a polymer film, in accordance with a first embodiment.
Figure 1B:
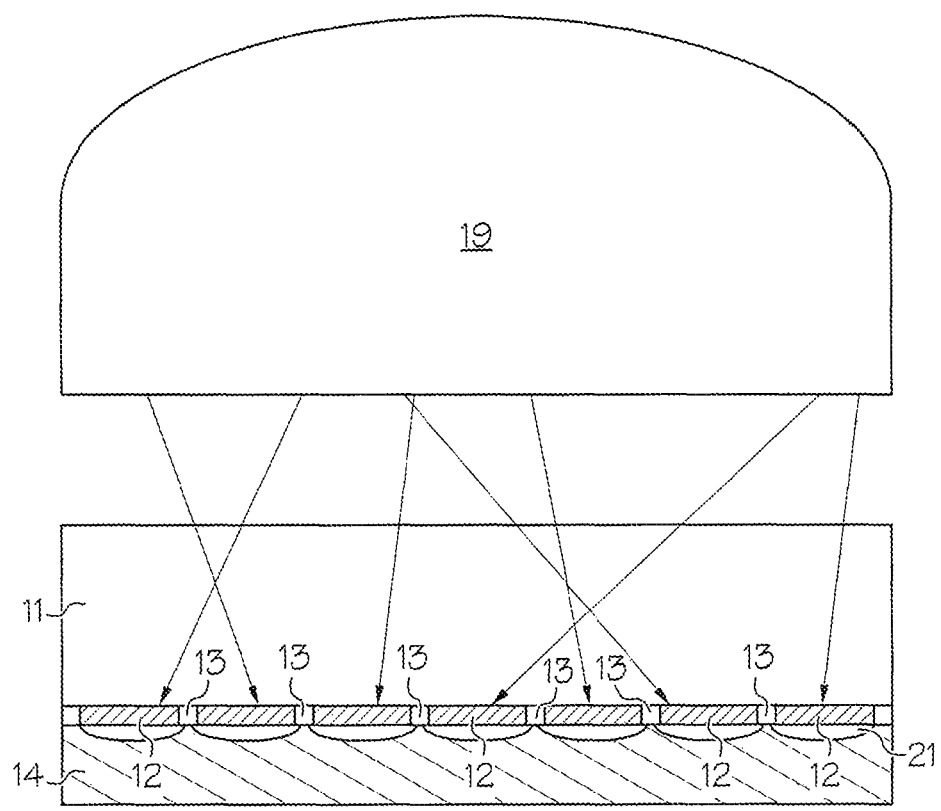
Figure 2:
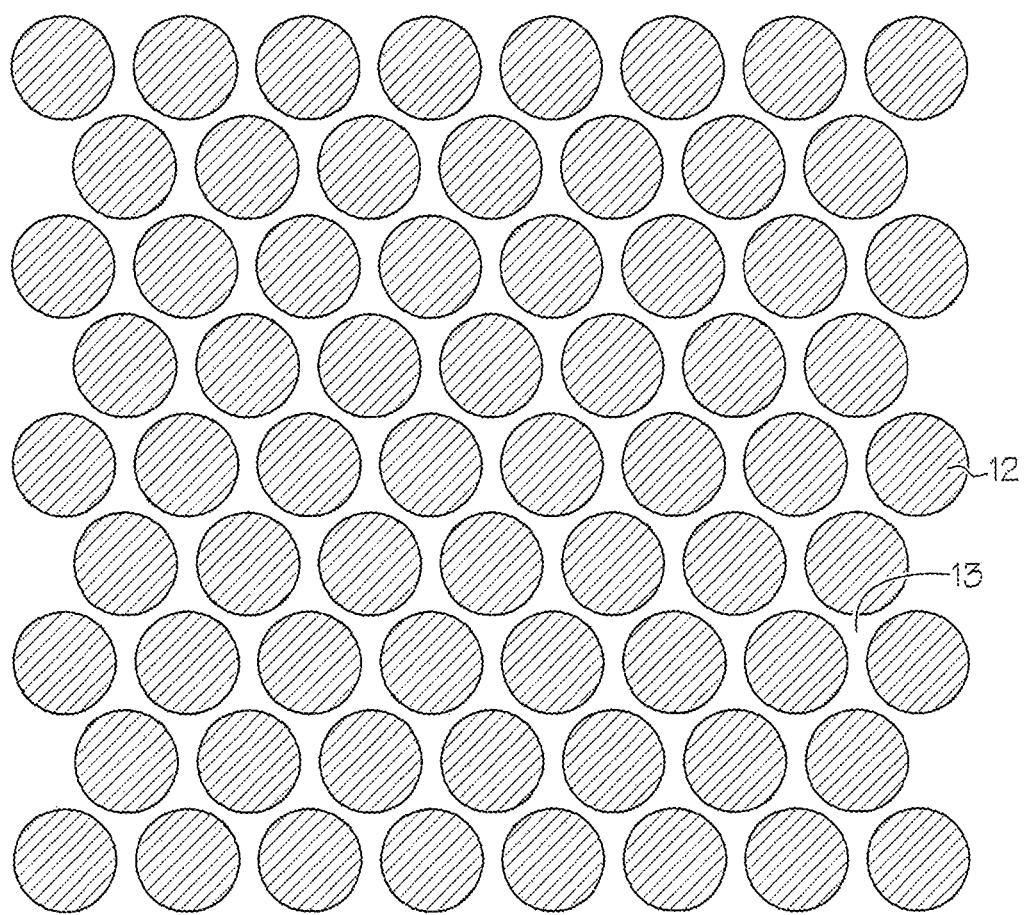
FIG. 2 shows a pattern of light-absorptive material and light-reflective material, as seen from the top.

Referring now to the drawings and in particular to FIGS. 1A-1B, there are depicted two diagrams of a method for performing selective delamination of a polymer film, in accordance with a first embodiment. First, a carrier plate 11 is partially covered with a layer of light-absorptive material 12. Preferably, carrier plate 11 is at least partially light transparent, and light-absorptive material 12 can be deposited on carrier plate 11 in a pixelated pattern, for example. Next, a layer of light-reflective material 13 is deposited on light-absorptive material layer 12, which renders the portions of carrier plate 11 not covered by light-absorptive material layer 12 to be reflective as viewed from the top of carrier plate 11, as shown in FIG. 2. A polymer film 14 is then deposited on light-absorptive material layer 12 and light-reflective material layer 13, followed by the formation of electronic structures (not shown) upon polymer film 14, as shown in FIG. 1A.

Polymer film 14 can be delaminated from carrier plate 11 by illuminating carrier plate 11 from the side opposite polymer film 14 with a light pulse from a flashlamp 19, as shown in FIG. 1B. The light pulse from flashlamp 19 heats light-absorptive material layer 12, and the heat will transfer to polymer film 14 to generate gas at an interface 21 between light-absorptive material layer 12 and polymer film 14 by decomposing polymer film 14.

As gas is generated at interface 21 between light-absorptive material layer 12 and polymer film 14, there is likewise no gas generated at the surface of polymer film 14 underneath the surface of light-absorptive material layer 12. By changing the ratio of absorptive to reflective surfaces (i.e., ratio of light-absorptive material layer 12 to light-reflective material layer 13), the gas generation level can be controlled at lamp facing side of polymer film 14 to delaminate polymer film 14 from carrier plate 11 without damaging the electronic structures formed upon polymer film 14.

Additional control of the gas generation can be attained by increasing the intensity and changing the time duration of a light pulse from flashlamp 19. In order to achieve additional control in the gas generated at carrier plate 11's facing surface of polymer film 14, additional layers may be deposited subsequent to light-absorptive material layer 12 and light-reflective material layer 13, as explained in FIGS. 3A-3B.

Figure 3A:
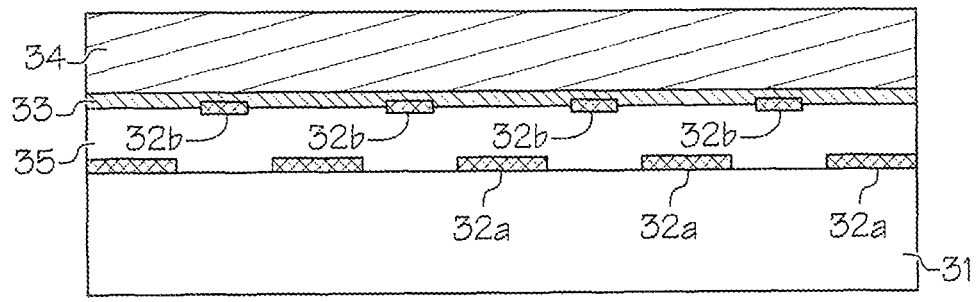
FIGS. 3A-3B illustrate a method for performing selective delamination of a polymer film, in accordance with a second embodiment.
Figure 3B:
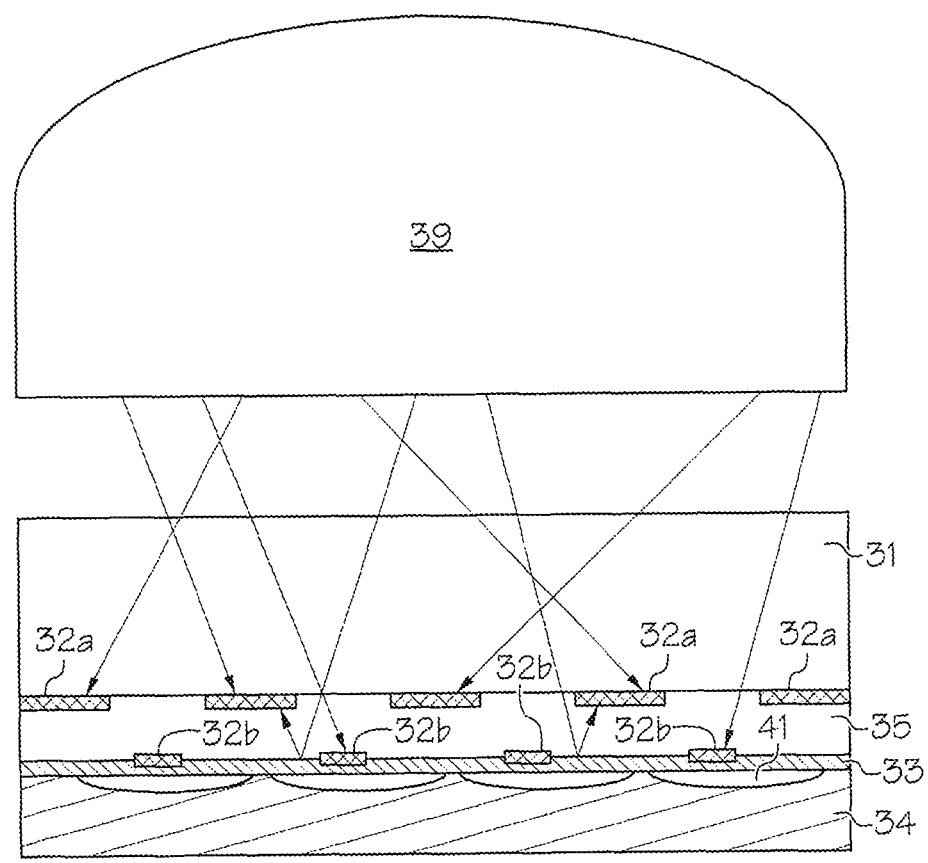

Referring now to FIGS. 3A-3B, there are depicted two diagram of a method for performing selective delamination of a polymer film, in accordance with a second embodiment. First, a carrier plate 31 is partially covered with a first light-absorptive material layer 32a, for example, in a pixelated pattern. Preferably, carrier plate 31 is at least partially light transparent. Next, a transparent thermal retardation layer 35 is deposited on light-absorptive material layer 32a. Thermal retardation layer 35 is then partially covered with a second light-absorptive material layer 32b, for example, in a pixelated pattern. Subsequently, a light-reflective film 33 is deposited on light-absorptive material film 32b, which renders portions of thermal retardation layer 35 not covered by light-absorptive material layer 32b to be reflective as viewed from the top of carrier plate 31, similar to FIG. 2. A polymer film 34 is then deposited on second light-absorptive material layer 32b and light-reflective material layer 33, followed by the formation of electronic structures (not shown) upon polymer film 34, as shown in FIG. 3A.

Thermal retardation layer 35 allows additional control in the gas generation because both light-absorptive material layers 32a, 32b are heated at the same time by a single light pulse. However, the heat pulse from carrier plate 31 facing first light-absorptive film 32a is delayed in time from second light-absorptive film 32b that is located closer to polymer film 34. The delay in time from the heat pulse creates a zipper effect to delaminate polymer film 34 more gently than that from a single light pulse as shown in FIG. 1B.

The same zipper effect to delaminate polymer film 34 from carrier plate 31 mentioned above can also be created by using a gray-scale pixels, where the inner part absorbs most of the light and the outer part absorbs less. During the illumination, phase change will always start at the inner part and propagates outward.

Furthermore, a surface tension controlled release layer (not shown) may be deposited on light-reflective material layer 33 before polymer film 34 is deposited. Additionally, a dynamic release layer (not shown) may be deposited before polymer film 34 is deposited. The dynamic release layer can be made of a material having a lower phase change temperature than polymer film 34, which helps preventing thermal damage to polymer film 34 from hot light-absorptive material layers 32a, 32b. The dynamic release layer can have two different mechanisms as there are two different types of phase changes it can undergo when heated. The first type of phase change is the gasification of the dynamic release layer. The second type is the melting of the dynamic release layer, which results in its de-stabilization due to surface tension. In both cases, polymer film 34 can be released from carrier plate 31. For the case in which the dynamic release layers melts, it is preferably made of a material with a low-melting point but with a very high surface tension, such as a metal or metal alloy. Preferably, the dynamic release layer is made of zinc or aluminum.

Optionally, in the first embodiment shown in FIG. 1A, a dynamic release layer may be deposited on light-reflective material layer 13 before depositing polymer layer 14. Also, a surface tension controlled layer may be deposited upon light-reflective material layer 13 before depositing polymer layer 14.

Carrier plates 11 and 31 may be made of glass or quartz. Light-absorptive material layers 12 and 32a-32b may be made of tungsten. Light-reflective material layers 13 and 33 may be made of aluminum. Polymer films 14 and 34 may be made of polyimide. Thermal retardation layer 36 may be made of silicon oxide or silicon dioxide. The surface tension controlled layer may be made of ceramic such as silicon dioxide or silicon nitride. The dynamic release layer can be a polymer or a metal with a relatively low melting temperature.

As has been described, the present invention provides an improved method for performing delamination of a polymer film. An advantage of the method of the present invention over the excimer laser delamination technique is that the light source is very inexpensive (~10×) and delamination area per pulse of light may be much larger (~1,000×) than that of the excimer laser.

While the invention has been particularly shown and described with reference to a preferred embodiment, it will be understood by those skilled in the art that various changes in form and detail may be made therein without departing from the spirit and scope of the invention.

What is claimed is:

1. A method for performing delamination of a polymer film, said method comprising:
    providing an optically transparent carrier plate;
    depositing a light-absorptive material layer onto said carrier plate;
    depositing a light-reflective material layer onto said light-absorptive material layer;
    depositing a polymer film on said light-reflective material layer and said light-absorptive material layer;
    forming electronic structures on said polymer film; and
    irradiating said carrier plate with a pulsed light to heat said light-absorptive material layer in order to release said polymer film from said carrier plate.

2. The method of claim 1, wherein said irradiating further includes irradiating said carrier plate with a flashlamp.

3. The method of claim 1, wherein said irradiating generates gas at an interface between said light-absorptive material layer and said polymer film to release said polymer film from said carrier plate.

4. The method of claim 3, wherein said gas generation level is controlled by changing a ratio between said light-absorptive material layer and said light-reflective material layer.

5. The method of claim 1, wherein said method further includes depositing a dynamic release layer on said light-reflective material layer before said polymer film is deposited.

6. The method of claim 5, wherein said dynamic release layer is made of metal.

7. The method of claim 1, wherein said carrier plate is made of quartz.

8. The method of claim 1, wherein said carrier plate is made of glass.

9. The method of claim 1, wherein said light-absorptive material layer is patterned.

10. The method of claim 1, wherein said light-absorptive material layer is not patterned.

11. A method for performing delamination of a polymer film, said method comprising:

Providing an optically transparent carrier plate;

depositing a first light-absorptive material layer onto said carrier plate;

depositing a thermal retardation layer onto said first light absorptive material layer;

depositing a second light-absorptive material layer onto said second light-absorptive material layer;

depositing a light-reflective material layer onto said second light-absorptive material layer;

depositing a polymer film on said light-reflective material layer and said second light-absorptive material layer;

forming electronic structures on said polymer film; and irradiating said carrier plate with a pulsed light to heat said light-absorptive material layers in order to release said polymer film from said carrier plate.

12. The method of claim 11, wherein said irradiating further includes irradiating said carrier plate with a flashlamp.

13. The method of claim 11, wherein said method further includes depositing a surface tension controlled release layer on said light-reflective material layer before said polymer film is deposited.

14. The method of claim 13, wherein said surface tension controlled release layer is made of ceramic.

15. The method of claim 13, wherein said method further includes depositing a dynamic release layer on said surface tension controlled release layer before said polymer film is deposited.

16. The method of claim 15, wherein said dynamic release layer is made of metal.

17. The method of claim 11, wherein one of said light-absorptive material layers is patterned.

18. The method of claim 11, wherein said carrier plate is made of quartz.

19. The method of claim 11, wherein said carrier plate is made of glass.

20. The method of claim 11, wherein said thermal retardation layer is made of silicon oxide.

* * * * *